United States Patent [19]
Kerner et al.

[11] Patent Number: 6,028,770
[45] Date of Patent: Feb. 22, 2000

[54] CONTROL DEVICE, ESPECIALLY FOR A MOTOR VEHICLE

[75] Inventors: Nikolaus Kerner, Wenzenbach; Reinhold Ott, Maxhütte-Haidhof; Günter Vogl, Parkstein, all of Germany

[73] Assignee: Siemens Aktiengesellschaft, Munich, Germany

[21] Appl. No.: 09/117,242
[22] PCT Filed: Jan. 20, 1997
[86] PCT No.: PCT/DE97/00089
 § 371 Date: Jul. 27, 1998
 § 102(e) Date: Jul. 27, 1998
[87] PCT Pub. No.: WO97/27728
 PCT Pub. Date: Jul. 31, 1997

[30] Foreign Application Priority Data

Jan. 25, 1996 [DE] Germany ............................ 196 02 637
Dec. 19, 1996 [DE] Germany ............................ 296 22 097

[51] Int. Cl.[7] ...................................................... H05K 7/20
[52] U.S. Cl. ......................... 361/704; 361/707; 361/711; 361/721; 165/80.2; 165/80.3; 174/16.3; 174/252; 439/485; 439/487
[58] Field of Search .................................... 361/699–704, 361/707, 709, 711, 721, 719; 439/485, 487; 165/80.2, 80.3, 185; 174/252, 16.1, 16.3

[56] References Cited

U.S. PATENT DOCUMENTS

| | | | |
|---|---|---|---|
| 5,089,936 | 2/1992 | Kojima et al. ............................ | 361/705 |
| 5,101,322 | 3/1992 | Ghaem et al. ............................ | 361/715 |
| 5,276,418 | 1/1994 | Klosowiak et al. ..................... | 361/704 |
| 5,281,154 | 1/1994 | Comerci et al. ......................... | 361/707 |
| 5,926,373 | 7/1999 | Stevens ................................... | 361/704 |

FOREIGN PATENT DOCUMENTS

| | | |
|---|---|---|
| 0 708 583 A1 | 4/1996 | European Pat. Off. . |
| 41 02 265 A1 | 7/1992 | Germany . |
| 42 40 754 A1 | 6/1994 | Germany . |
| 42 40 755 A1 | 6/1994 | Germany . |
| 44 37 664 A1 | 4/1996 | Germany . |

*Primary Examiner*—Leo P. Picard
*Assistant Examiner*—Boris L. Chervinsky
*Attorney, Agent, or Firm*—Hill & Simpson

[57] ABSTRACT

In a control device for a motor vehicle having a cooling plate between an upper component of the housing and a lower component of the housing wherein a first printed circuit board which is fitted with an electrical circuit is mounted on the cooling plate. Arranged underneath the cooling plate is a plug component on the lower component of the housing. Plug pins of the plug component are fitted into a second printed circuit board which is also arranged underneath the cooling plate. The plug pins are electrically connected to the first printed circuit board via conductor tracks of the second printed circuit board and connecting elements between the second printed circuit board and the first printed circuit board.

22 Claims, 6 Drawing Sheets

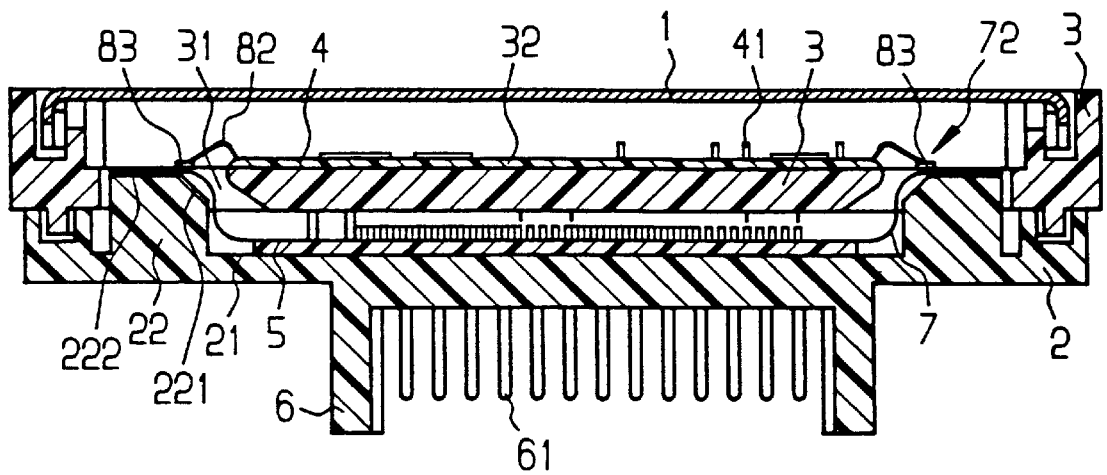
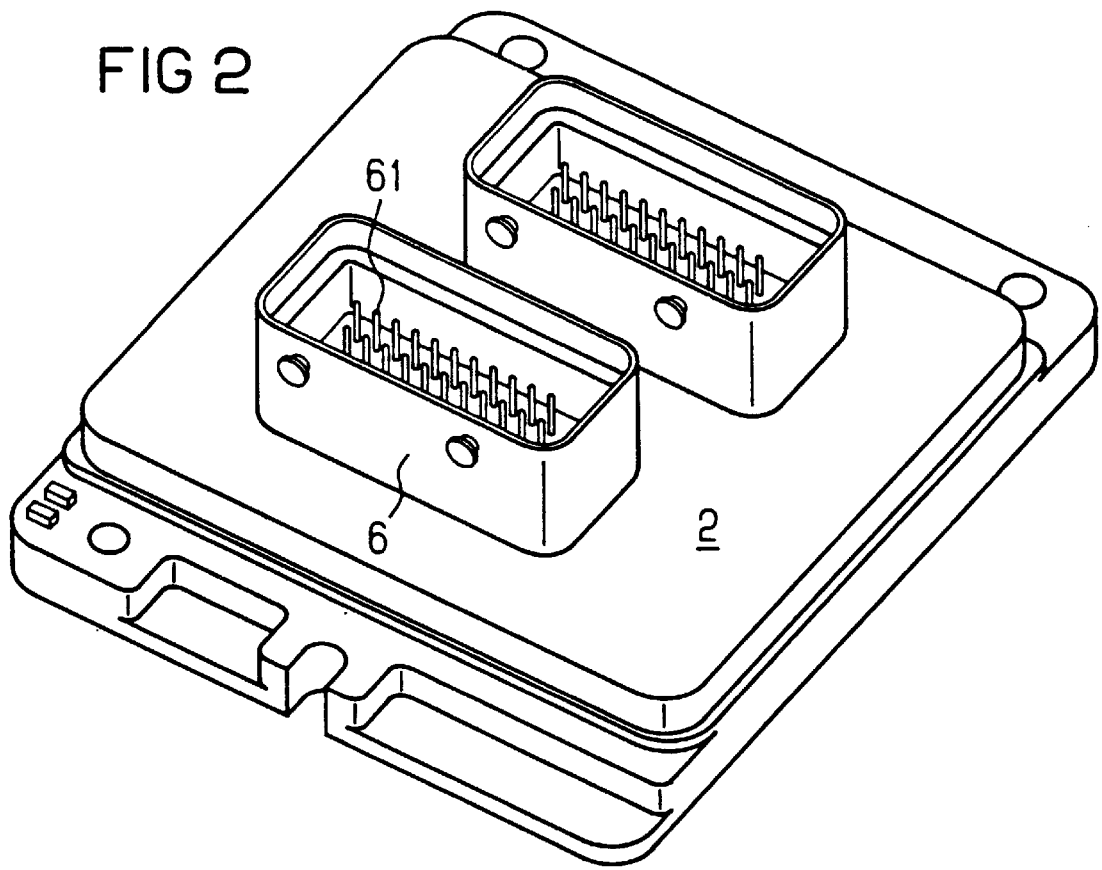

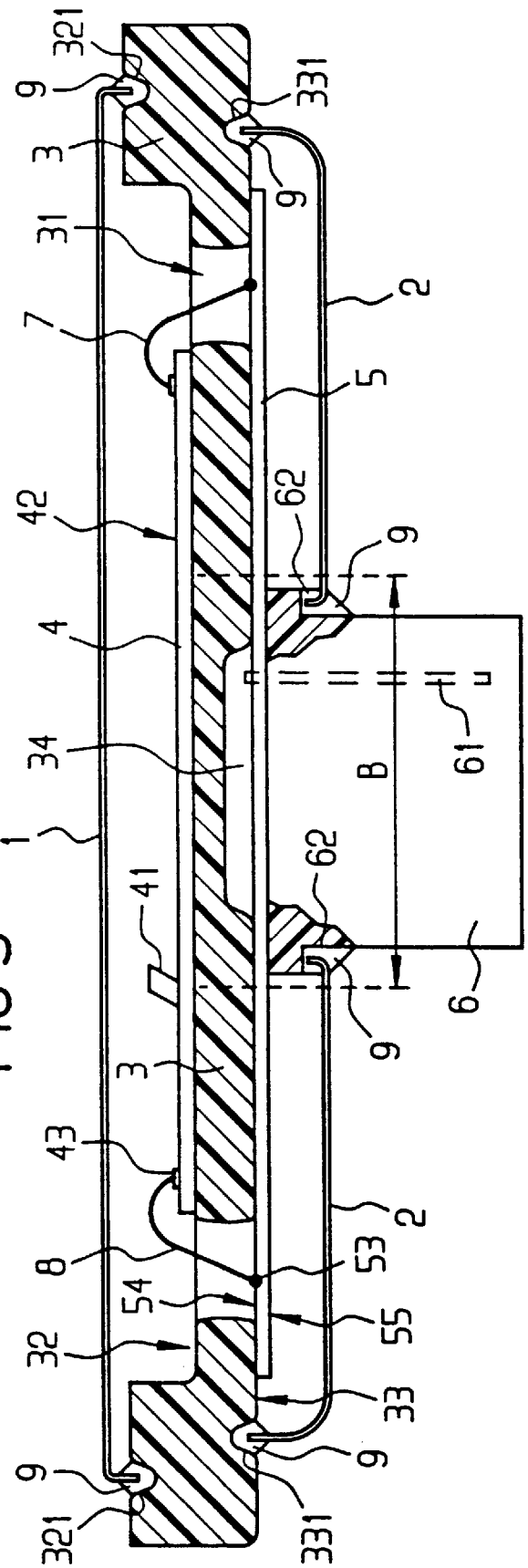

CONTROL DEVICE, ESPECIALLY FOR A MOTOR VEHICLE

BACKGROUND OF THE INVENTION

1. Field of the Invention

The present invention relates to a control device for a motor vehicle having a cooling plate mounted between upper and lower components of a housing wherein the cooling plate includes a first printed circuit board mounted thereon. A plug component is mounted on a lower component of the housing and includes plug pins which are fitted into a second printed circuit board arranged underneath the cooling plate. The plug pins are electrically conductively connected to the first printed circuit board via conductor tracks of the second printed circuit board and connecting elements between the second and first printed circuit boards.

2. Description of the Prior Art

The document DE 41 02 265 A1 discloses a control unit whose housing is formed by a cold plate and a housing upper part. A printed circuit board, which is fitted with an electrical circuit, is arranged on the top of the cold plate, in the interior of the housing. A plug part having plug pins is arranged underneath the cold plate, fitted to it. The plug pins project through an opening in the cold plate and are passed into the printed circuit board, which is clamped over the opening, so that the plug pins and circuit are electrically conductively connected.

This control unit permits only a limited number of plug pins since the region of the printed circuit board which is intended to accommodate the plug pins, and which is arranged above the opening in the cold plate, is not available for the actual electrical circuit. In consequence, a large number of plug pins necessitate a printed circuit board having a large area and thus a control unit having large dimensions. This is disadvantageous when the installation location is a motor vehicle, with its limited space availability. If the progress in technology makes possible a smaller printed circuit board with an unchanged circuit extent and the same number of plug pins, the control unit dimensions will be reduced only slightly, however, since a relatively large region of the printed circuit board must be provided for the accommodation of the plug pins, and this region cannot be reduced in size. Furthermore, the position of the plug part with respect to the printed circuit board is fixed.

The known control unit concept is also disadvantageous from the point of view of electromagnetic compatibility since electromagnetic radiation can be emitted directly to the printed circuit board, via the plug pins, through the opening in the cold plate. Weakly and strongly radiating signal paths cannot be physically separated from one another until they are on the printed circuit board. In addition, the plug pins are passed into the central region of the printed circuit boards which results in omnidirectional radiation of electromagnetic waves to the entire circuit.

SUMMARY OF THE INVENTION

An object of the present invention is to provide a control unit whose dimensions are compact and which can accommodate one or more plug parts, even with a large number of plug pins, while the printed circuit board which is fitted with the circuit has a small surface area extent.

Such object is achieved by the present invention wherein a second printed circuit board is arranged underneath the cold plate. The plug pins are electrically connected to the second printed circuit board. The second printed circuit board is electrically conductively connected to the first printed circuit board via connecting elements.

That broad side of the cold plate on which the first printed circuit board is arranged is called the "top" in the following text. The other broad side of the cold plate is called the "underneath" in the following text. The physical terms "above" and "underneath" the cold plate are used in a corresponding manner.

The solution according to the present invention has the advantage that the control unit may have, on the underneath of its cold plate, one or more plug parts even with a large number of plug pins. The size of the cold plate is governed by the size of the first printed circuit board and thus the extent of the electrical circuit, or by the area which is required for the plug parts, without these two influencing variables being correlated with one another.

The plug part is preferably arranged on a housing lower part which accommodates the second printed circuit board and which is mechanically connected to the cold plate or to the housing upper part. The plug pins are passed into the second printed circuit board and are electrically conductively connected to the first printed circuit board via the connecting elements.

Further advantages of the control unit according to the present invention are disclosed in the description of the figures.

Additional features and advantages of the present invention are described in, and will be apparent from, the Detailed Description of the Preferred Embodiments and the Drawings.

DESCRIPTION OF THE DRAWINGS

FIG. 1 shows a longitudinal section through a control unit according to the present invention.

FIG. 2 shows a perspective view of a housing lower part from underneath.

FIG. 9 shows a transverse section through a further control unit according to the present invention.

DETAILED DESCRIPTION OF THE PREFERRED EMBODIMENTS

Figure 3:
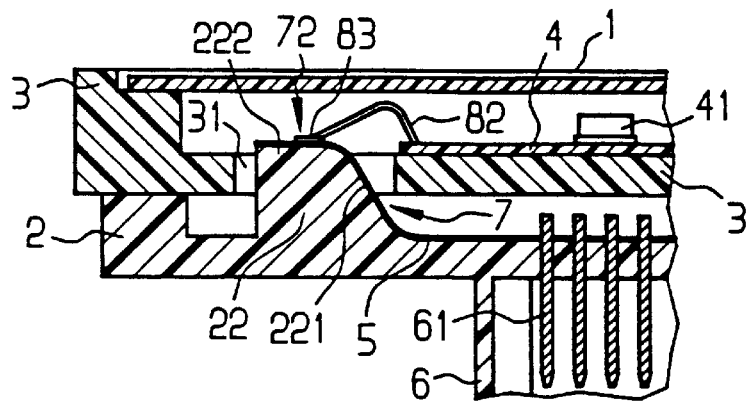
FIG. 3 shows a cutaway longitudinal section through a control unit.

FIG. 1 shows a longitudinal section through a control unit according to the present invention having a housing upper part 1, a housing lower part 2, and a cold plate 3 between the housing upper part 1 and the housing lower part 2. A plug part 6 having plug pins 61 is arranged underneath the cold plate. A first printed circuit board 4, which is fitted with an electrical circuit having components 41, is mounted on the cold plate 3. A second printed circuit board 5 is mounted on the inside 21 of the housing lower part 2, facing the cold plate 3 and above the plug part 6. Two connector parts 7 are integrally connected to the second printed circuit board 5 and contain regions 72 having contact surfaces 83. The contact surfaces 83 are connected to the first printed circuit board 4 via bonding wires 82. The housing lower part 2 contains webs 22 having ramps 221 and ends 222; the regions 72 of the connector being arranged, with the contact surfaces, on the ends 222 of the webs 22. The webs 22 project through openings 31 in the cold plate 3.

The cold plate 3 is designed as a metal plate, for example made of aluminium, as a metal sheet, or as a die-cast or stamped part made of metal, and is used for cooling the electrical components 41 on the printed circuit board 4, or alternatively, in particular, for cooling power components which are not shown in FIG. 1 and are arranged on the printed circuit board 4 or, in an even better configuration, directly on the cold plate 3 or via thermally conductive component holders on the cold plate 3. Secondly, the cold plate 3 protects the electrical circuit on the printed circuit board 4 against incident electromagnetic radiation (EMC radiation). At the same time, the cold plate 3, with the housing upper part 1 which is made of metal, forms a virtually closed, EMC-screening housing chamber 1, 3, made of metal. The housing upper part 1 and the cold plate 3 are in this case mechanically connected to one another using a conventional connecting technique such as crimping, peening, bonding or screwing.

The first printed circuit board 4 can be bonded or laminated onto the cold plate 3 as a conventional single or multi-layer printed circuit board or as a flexible printed circuit board, using an adhesive which is electrically insulating but is highly thermally conductive. The first printed circuit board 4 can also be fitted with a hybrid circuit.

The housing lower part 2 is preferably produced integrally with the plug part 6, from plastic (injection moulded). The webs 22 are in this case likewise formed integrally with the housing lower part 2. The plug pins 61 are extrusion coated or inserted in the same production step. The housing lower part 2 is connected to the cold plate 3 using a known connecting technique; for example, with a combined snap-action and bonded connection (see latching hooks 23 and potting compound 24 in FIG. 8). The cold plate 3 has appropriate contours on its circumference for this purpose. The housing lower part 2, the housing upper part 1 and the metal plate are connected to form a waterproof housing.

Figure 5:
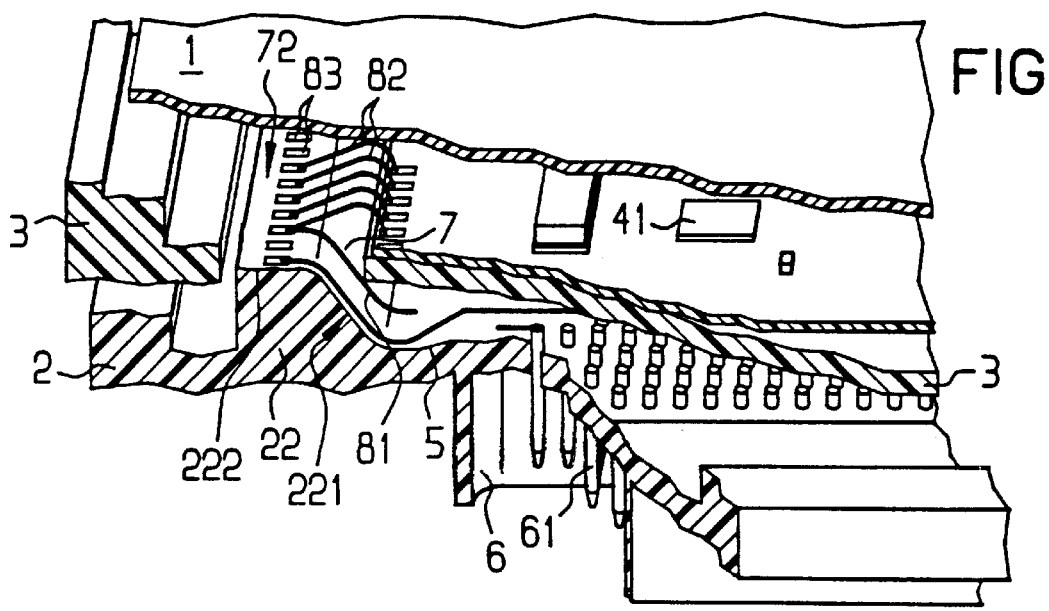
FIG. 5 shows a perspective view of a control unit, which is cut away in various levels, from above.

The second printed circuit board 5 is bonded onto the inside 21 of the housing lower part 2. It is designed integrally with the connector parts 7 as a flexible printed circuit board and is mounted by its ends on the ends 222 of the webs 22. The plug pins 61 are passed into the flexible printed circuit board 5, 7 and are soldered to said flexible printed circuit board 5, 7 on its top. As can be seen from FIG. 5, the flexible printed circuit board 5, 7 has conductor tracks 81 which pass from the plug pins 61 to the contact surfaces 83. The contact surfaces 83 are arranged at the level of the first printed circuit board 1 with the aid of the webs 22, and are connected to said first printed circuit board 1 via bonding wires. The plug pins 61 are thus electrically conductively connected to the first printed circuit board 4 via the conductor tracks 81, the contact surfaces 83 and the bonding wires 82 as connecting elements 8.

FIG. 3 shows a cutaway longitudinal section of the control unit according to the present invention which essentially differs from that which is shown FIG. 1 in that the flexible printed circuit board 5, 7 is guided towards the ends 222 of the webs 22 via inclined ramps 221 on said webs 22.

Figure 4:
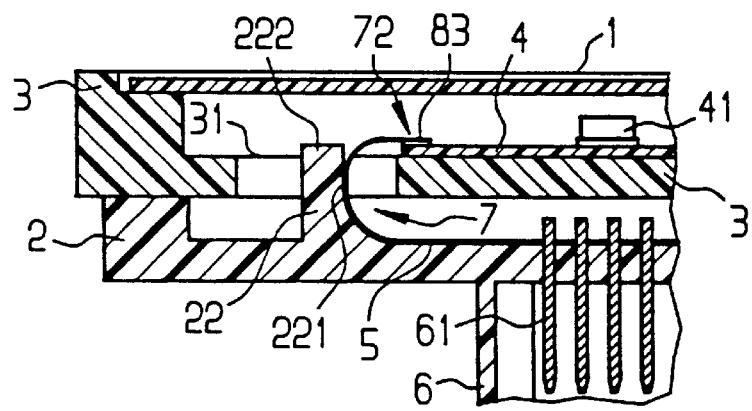
FIG. 4 shows a further cutaway longitudinal section through a control unit.

FIG. 4 shows a further variant of the connection between the second printed circuit board 5 and the first printed circuit board 4; the flexible printed circuit board 5, 7 is guided along the ramps 221 through the openings 31 in the cold plate 3, but is then not mounted by its ends on the ends 222 of the webs 22 but is folded over onto the first printed circuit board 4, so that at least the region 72 with the contact surfaces 83 is resting on the first printed circuit board 4. The contact surfaces 83 are electrically conductively connected by soldering or using conductive adhesive to corresponding contact points on the first printed circuit board 4, so that an electrically conductive connection is once again produced from the plug pins 61, via the conductor tracks 81 and the contact surfaces 83, to the first printed circuit board 4.

Figure 7:
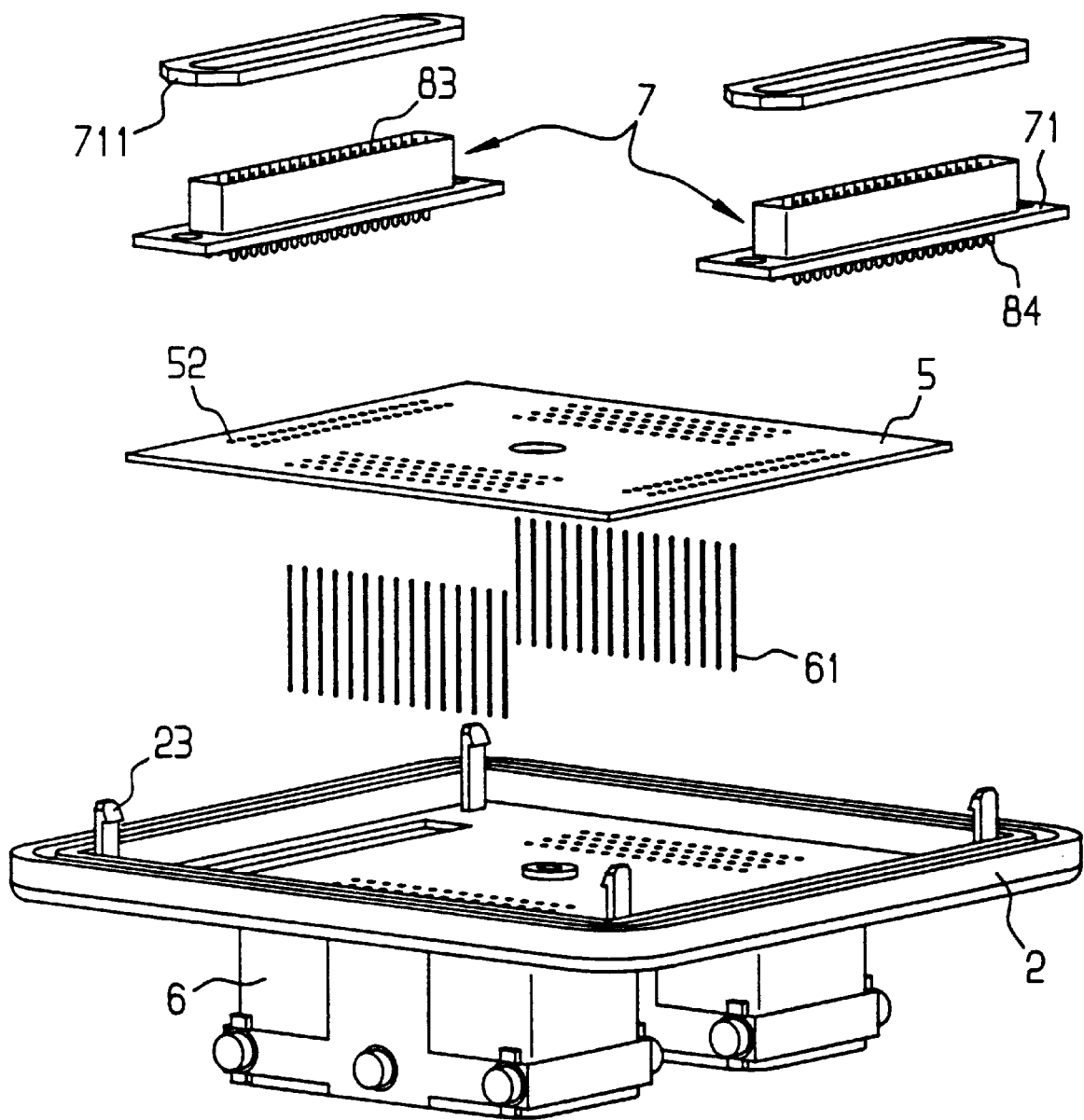
FIG. 7 shows an exploded illustration of components of a control unit.

FIG. 7 shows an exploded illustration of a further variant of the connection between the second printed circuit board 5 and the first printed circuit board 4 with those elements of the control unit which are arranged facing the underneath of the cold plate 3; the second printed circuit board 5 is designed as a rigid printed circuit board. A flexible printed circuit board can also be provided instead of the rigid printed circuit board. Conductor tracks, which are not shown, on the second printed circuit board 5 electrically connect the plug pins 61, which are passed into the second printed circuit board 5 in the assembled state, to plug-in locations 52. Connector parts 7, which are designed as contact strips 71, are plugged into these plug-in locations 52 and are soldered to the conductor tracks of the second printed circuit board 5. The contact strips 71 contain extrusion-coated contact pins 84, which may be designed as stamped and bent parts. Contact surfaces 83 are arranged on the end of the contact strips. When the control unit is assembled, the contact strips project through the opening 31 in the cold plate 3, the contact surfaces 83 also being arranged at the same level as the first printed circuit board 4 in this exemplary embodiment, such that bonding to the first printed circuit board 4 can be carried out at the level of the contact surfaces 83.

Figure 8:
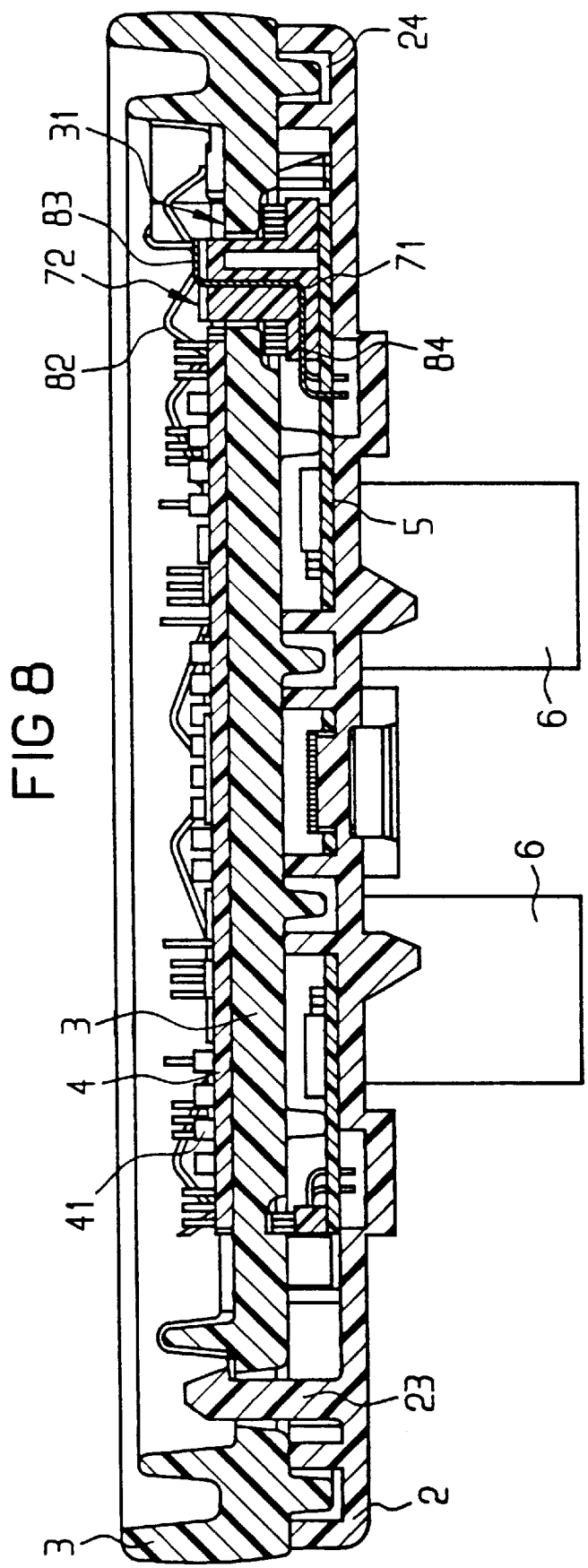
FIG. 8 shows a further longitudinal section through a control unit.

FIG. 8 shows a longitudinal section of such a control unit having contact strips 71 as connector parts 7.

The contact strip can also be designed in the form of a Γ, so that the underneath of the longitudinal bar of the contact strip is passed into the plug-in location in the second printed circuit board. The contact surfaces can then be mounted on the underneath of the transverse bar. When such a contact strip is being fitted, the contact surfaces are guided from above onto corresponding contact points on the first printed circuit board, and are electrically connected to these contact points (corresponding to FIG. 4).

The mechanical connection between the second printed circuit board 5 and the housing lower part 2 may be designed as required, for example using rivets, dome-type connections, adhesive or screws.

In the case of a plug part having large dimensions, the second printed circuit board may under some circumstances be arranged with its entire extent above the plug part so that, in this embodiment, the housing lower part and the plug part form a unit. The housing lower part, together with the cold plate, in this case also forms a housing chamber for accommodation of the second printed circuit board.

FIG. 2 shows a perspective view of a housing lower part 2, which has two plug parts 61, from underneath.

Figure 6:
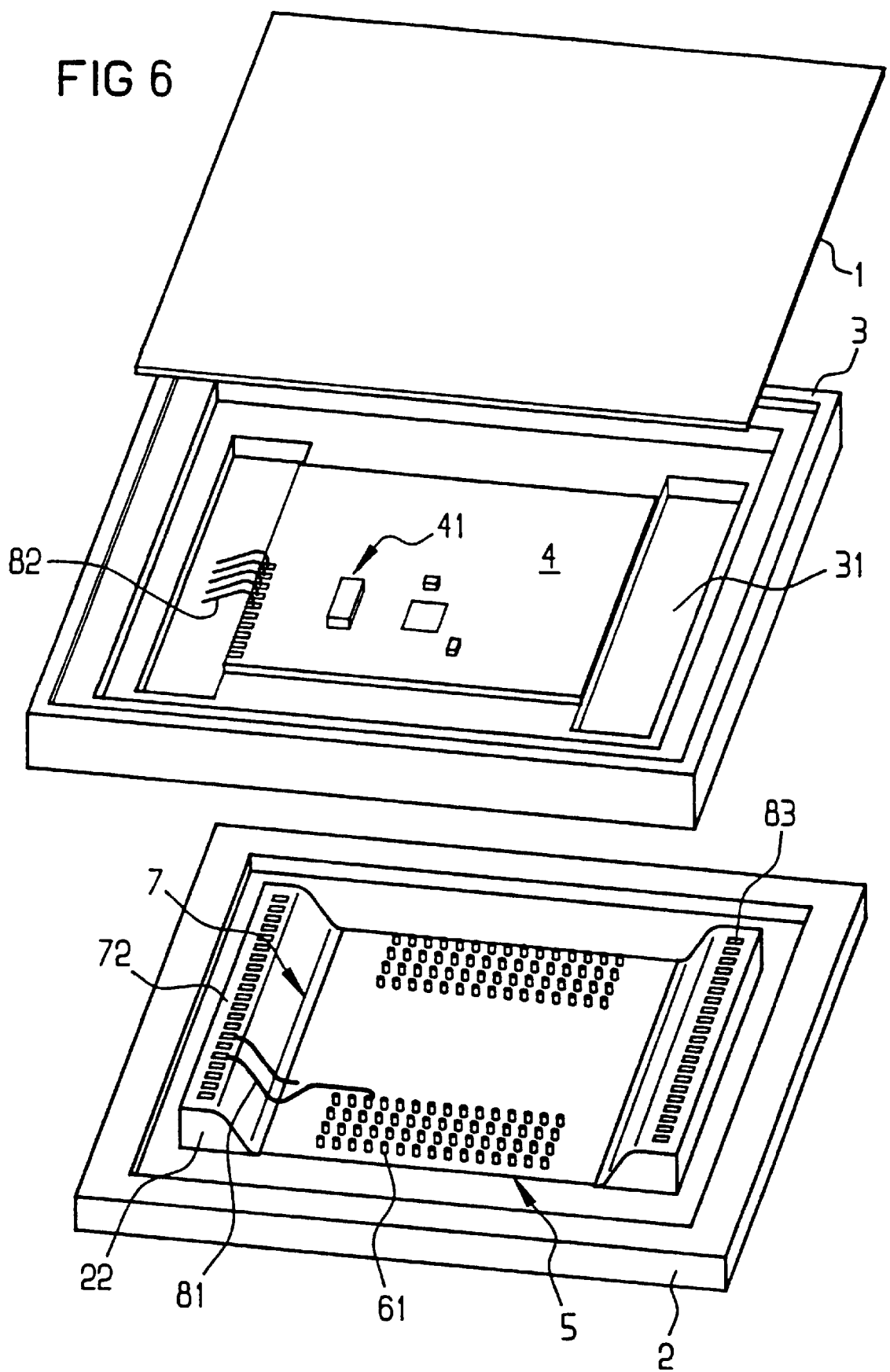
FIG. 6 shows an exploded illustration of a control unit.

FIG. 6 shows an exploded illustration of the control unit according to FIG. 1, which has two openings 31 in the edge region of the cold plate 3. Because of the EMC radiation which is transported via the connecting elements 8 into the housing chambers 1, 3, it is advantageous for these openings 31 to be incorporated in the edge region of the cold plate 3. Depending on the number of plug pins 61, the cold plate 3 may have one, two, three or four openings, the first printed circuit board 4 in an embodiment having four openings 31 preferably being surrounded by these four openings 31.

FIG. 9 shows a longitudinal section through a further control unit according to the present invention having a housing upper part 1, a housing lower part 2 and a cold plate 3 between the housing upper part 1 and the housing lower part 2. A plug part 6 having plug pins 61, which are indicated by dashed lines, is arranged underneath the cold plate 3. A first printed circuit board 4, which is fitted with an electrical circuit having components 41, is mechanically firmly connected to the top 32 of the cold plate 3. A second printed circuit board 5 is mounted on the underneath 33 of the cold plate 3, between the cold plate 3 and the plug part 6. The first printed circuit board 4 and the second printed circuit board 5 are electrically connected to one another via connecting elements 7, which are designed as bonding wires.

The first printed circuit board 4 may be bonded or laminated to the cold plate 3 as a conventional single or multi-layer printed circuit board or as a flexible printed circuit board using an adhesive coating which is electrically insulating but is highly thermally conductive. The first printed circuit board 4 should also be regarded here in general as a circuit mount which is fitted, in particular, with a circuit for engine or transmission control for a motor vehicle. This circuit mount is preferably designed as a hybrid circuit mount, that is to say it has no ceramic base.

In FIG. 9, the second printed circuit board 5 is preferably designed as a rigid, conventional plastic printed circuit board which is bonded or laminated onto the cold plate 3. In this case, it is not necessary for the entire printed circuit board surface to be in contact with the heat sink. Since the second printed circuit board is mounted on or firmly connected to the heat sink, forces which are introduced on the plug part 6 and are caused, for example, by a cable harness which is connected to the plug part and vibrates with it are not transmitted to the electrical connecting elements 7. To this end, the plug part 6 is preferably not mechanically connected to the second printed circuit board—apart from the electrical contact points. Because of the fixed mechanical connection between the second printed circuit board 5 and the cold plate 3, forces which may be introduced to the second printed circuit board 5 via the electrical contact points are not transmitted to the connecting elements 7 between the first printed circuit board 4 and the second printed circuit board 5, these connecting elements 7 being sensitive to mechanical stress and being susceptible to fracture. The control unit is thus more reliable.

The plug pins 61 are guided or pressed into the second printed circuit board 5 and are possibly soldered to it, on its top 52. The cold plate 3 has a cut out 34 for accommodating the plug pin tips which project from the top of the second printed circuit board 5. In contrast to the first printed circuit board 4, the second printed circuit board 5 covers openings 31 in the cold plate 3. The second printed circuit board 5 has conductor tracks which are not shown and pass from the plug pins 61 to contact surfaces 51 which are arranged in the region of the openings 31 on the top 52 of the second printed circuit board 5.

If the plug pins 61 on the top 52 of the second printed circuit board 5 are soldered to the latter and if, for example, the second printed circuit board 5 is designed as a single-layer printed circuit board with conductor tracks on its top 52, then the second printed circuit board 5 has an insulating coating on its top 52, at least in the region in which it is mounted by its top 52 on the underneath 33 of the cold plate 3. Alternatively, the second printed circuit board 5 is designed as a multilayer printed circuit board. A configuration of the plug part 6 as a surface-mounted SMD plug part is also advantageous, in particular. In this way, the plug pins 61 on the underneath 53 of the second printed circuit board 5 are soldered or bonded to it. The second printed circuit board 5 then preferably has conductor tracks on its underneath 53. Through-contact is then made with the conductor tracks on the underneath 53 from the contact surfaces 51 on the top 52 of the printed circuit board 5.

At least some of the plug pins 61 are electrically conductively connected directly to the contact surfaces 43 on the first printed circuit board 4 via the conductor tracks on the second printed circuit board 5, the contact surfaces 53 on the second printed circuit board 5 and the connecting elements 7. Alternatively, electrical components may be arranged on the second printed circuit board 5, the signals which are passed via the plug pins 61 essentially being preprocessed by these components and not being supplied to the circuit on the first printed circuit board 4 until this has been done.

The connecting elements 7 are designed, in particular, as bonding wires between the contact surfaces 51 on the second printed circuit board 5 and contact surfaces 43 on the top 42 of the first printed circuit board 4. Bonding wires as connecting elements 7 are advantageous in particular if the first printed circuit board 4 is a hybrid circuit mount.

Alternatively, other connecting elements 7 may be used. For example, contact strips may be used according to FIG. 7.

The plug part 6 is connected to the cold plate 3 by rivets, screws or by peening or bonding. The securing means may in this case be passed through cut outs in the second printed circuit board 5, or may be arranged alongside the second printed circuit board 5. According to the invention, the plug part 6 is mounted on the cold plate 3 in a region B which is characterized by the electrical contact points between the plug pins 61 and the second printed circuit board 55, as a result of which the connection between the plug part 6 and the cold plate 3 is designed such that it is resistant to shaking. As a result of this mechanical method of securing, forces which are introduced on the plug part 6 and are, for example, caused by a motor vehicle cable harness which is connected to the plug part 6 and vibrates with it are absorbed directly at their point of introduction—likewise the plug part 6—without being able to propagate via further control unit components which are capable of oscillation. In order to avoid stressing the contact points between the plug pins 61 and the second printed circuit board 5, the points—likewise the mounting points—at which forces are transmitted from the plug part 6 to the cold plate 3 and are absorbed are arranged close to the contact points. These forces are not passed on to the second printed circuit board 5 and the connecting elements 7. In particular, the thin-wire bonding connections, which are at risk of fracture, between the first printed circuit board 4 and the second printed circuit board 5 are relieved of mechanical stress even if the plug part 6 is vibrating severely. With regard to possible vibration stress, the entire control unit is designed to be mechanically stiff and is therefore reliable in operation in a rugged environment, such as that in a motor vehicle.

Together with the cold plate 3, the housing lower part 2 roughly forms a chamber in which the second printed circuit board 5 is arranged, with the plug part 6. If the housing lower part 2 is made from metal, then good electromagnetic screening is achieved, since the entire housing, comprising the cold plate 3, the housing upper part 1 and the housing lower part 2, is produced from metal, so that the electrical circuit and the conductor tracks in the housing interior are well screened.

If the control unit is used, for example, in the engine compartment, the control unit must be designed, in particular, to be sealed: to this end, the cold plate has grooves 321 and 331 on its top 32 and underneath 33, these grooves being filled with a sealing compound 8. The edge of the housing upper part 1 and of the housing lower part 2, respectively, is introduced into the corresponding groove. The housing lower part 2 and the plug part 6 are also sealed from one another. According to the figure, the plug part 6 has a groove 62 which is filled with a sealing compound 8 and in which the corresponding edge of the housing lower part 2 engages.

The plug part 6 is preferably produced integrally with the housing lower part 2 from plastic, which possibly has metal particles added to it in order to improve the electromagnetic screening. In any case, the actual plug part 6 must also be firmly connected to the cold plate 3 here, in particular close to the contact points between the plug pins 61 and the second printed circuit board 5.

In particular, the control unit concept according to the present invention has the following advantages:

Plug parts may be arranged over the entire plan area of the cold plate, facing its underneath, or a plug part having a large number of plug pins may itself occupy the entire plan area of the cold plate, without it being necessary to enlarge the first printed circuit board because of the number of plug parts/plug pins.

The plug parts may be arranged at any required point on the underneath of the cold plate.

The control unit may have a large number of plug pins, since the plug pins are first connected to the conductor tracks on the second printed circuit board: as a result of the relatively small structural size of conductor tracks, contact pins, contact surfaces and bonding wires as connecting elements between the second printed circuit board and the first printed circuit board, the coarse grid of the plug pins, which are designed to be close together because of their mechanical stresses, is converted into a considerably finer connecting grid for the contact surfaces. Since the above-mentioned connecting elements between the plug pins and the first printed circuit board are subject to scarcely any mechanical stress, they may be designed to be thin.

The positioning of the connector part is independent of the positioning of the plug part. In particular, with respect to electromagnetic screening, the connector part is thus preferably arranged at the edge of the electrical circuit/first printed circuit board while, in contrast, the plug part is arranged in a stable manner in the central region of the cold plate, underneath said cold plate. On the other hand, if a different plug part is used—for example with different signals applied to the plug pins or a greater/lesser number of plug pins—or an arrangement of an additional plug is used, only the conductor track routing on the second printed circuit board and the housing lower part/plug part need to be modified. The actual electrical circuit may remain unchanged.

The free choice of the conductor track routing on the second printed circuit board allows the conductor tracks to be routed to comply with EMC requirements. Thus, even sensitive signal paths on the second printed circuit board may be isolated from strongly radiating signal paths, it being possible to arrange an earth line between these signal paths, to absorb EMC radiation. Conductor tracks which are sensitive to EMC are fed to the first printed circuit board, for example, physically grouped via a first connector part: components which are susceptible to interference are then arranged close to the first connector part on the first printed circuit board. Strongly radiating conductor tracks, on the other hand, are fed to the first printed circuit board physically grouped via a second connector part; components which are susceptible to interference are then arranged close to the second connector part on the first printed circuit board.

The cold plate and the housing upper part result in the production of a housing chamber which is virtually EMC-proof and in which the first printed circuit board is arranged, with the electrical circuit. In order to improve the EMC characteristics of the control unit further, electromagnetic radiation which penetrates into the control unit via the plug pins can be dissipated, close to the plug part, by means of a metallized region on the second printed circuit board. If the second printed circuit board is designed as a multilayer printed circuit board, one of the layers may contain the metallized region.

Electrical components may also be arranged on the second printed circuit board.

A bonding link between contact surfaces on the connector part and the first printed circuit board is advantageous, particularly if the electrical circuit is designed as a hybrid circuit. If the contact surfaces on the connector part, which are linked via bonding wires, and corresponding contact points on the first printed circuit board are level (see FIG. 3), then the tensile strength of the bonding link is increased since any vertical stress on the bonding link does not lead immediately to tearing of the bonding wires, in just the same way as horizontal stress. The bonding wires can thus be designed to be thinner; furthermore, they are considerably shorter than in the case of a bonding link between contact surfaces at different levels. The bonding link is thus more reliable overall.

In the case of the control unit according to the present invention, sufficient space is also provided to produce the bonding links. According to FIG. 3, there is sufficient space on the left-hand side of the contact surfaces 83 to allow a bonding tool to fit the bonding wire to the contact surface 83. The space on the left-hand side of the contact surface is not blocked by plugs or other housing components. There is likewise sufficient space on the right-hand side of the contact points which are arranged on the first printed circuit board, so that the bonding tool can tear off any projecting bonding wire on the right-hand side of the contact points. The space on the right-hand side of the contact points is once again not adversely affected in this case by a connector or other housing components.

Although the present invention has been described with reference to specific embodiments, those of skill in the art will recognize that changes may be made thereto without departing from the spirit and scope of the invention as set forth in the hereafter appended claims.

We claim as our invention:

1. A control device for a motor vehicle, comprising:
   a cooling plate;
   a first printed circuit board arranged on an upper side of the cooling plate;
   a plug component with plug pins, the plug component arranged on a side of the cooling plate facing away from the first printed circuit board;
   a second printed circuit board arranged between the plug component and the cooling plate on the side of the cooling plate facing away from the first printed circuit board, wherein the plug pins are in contact solely with the second printed circuit board; and connecting elements for electrically connecting the second printed circuit board to the first printed circuit board.

2. A control device as claimed in claim 1, further comprising:

conductor tracks on the second printed circuit board, wherein the plug pins are electrically connected to the first printed circuit board via the conductor tracks and the connecting element.

3. A control device as claimed in claim 1, wherein the first printed circuit board is a hybrid circuit carrier.

4. A control device as claimed in claim 1, further comprising:

an upper housing component, wherein the upper housing component and the cooling plate form a first housing chamber for the first printed circuit board.

5. A control device as claimed in claim 1, further comprising:

a lower housing component, wherein the lower housing component and the cooling plate form a second housing chamber for the second printed circuit board and the second printed circuit board is arranged on the inside of the lower housing component.

6. A control device as claimed in claim 1, wherein:

an upper housing component and the cooling plate collectively form a housing chamber;

the plug component is electrically connected to the first printed circuit board;

the cooling plate is arranged between the upper housing component and a lower housing component;

the second printed circuit board is arranged between the cooling plate and the lower housing component;

the plug component is arranged underneath the second printed circuit board on the lower housing component; and a connector component including at least one section of the connecting element is provided.

7. A control device as claimed in claim 1, wherein the plug component is permanently connected to the cooling plate.

8. A control device as claimed in claim 1, wherein the plug component is attached directly to the cooling plate.

9. A control device as claimed in claim 1, wherein the connecting elements are bonding wires.

10. A control device as claimed in claim 1, wherein the cooling plate includes an opening not covered by the first printed circuit board through which the connecting elements are routed.

11. A control device for a motor vehicle, comprising:

a cooling plate;

a first printed circuit board arranged on an upper side of the cooling plate;

a plug component with plug pins, the plug component arranged on a side of the cooling plate facing away from the first printed circuit board;

a second printed circuit board arranged between the plug component and the cooling plate on the side of the cooling plate facing away from the first printed circuit board, wherein the plug pins are in contact solely with the second printed circuit board;

connecting elements for electrically connecting the second printed circuit board to the first printed circuit board, wherein the cooling plate includes an opening not covered by the first printed circuit board through which the connecting elements are routed; and a connector component projecting into the opening of the cooling plate, the connector component including at least one section of the connecting elements.

12. A control device as claimed in claim 11, wherein the connector component is a multi-point connector having contact pins electrically connected to the second printed circuit board.

13. A control device as claimed in claim 11, wherein the connector component and the second printed circuit board collectively form a flexible printed circuit board.

14. A control device as claimed in claim 11, wherein the connector component includes contact areas electrically connected to the connecting elements.

15. A control device as claimed in claim 14, further comprising:

bonding wires leading from the contact areas to the first printed circuit board.

16. A control device as claimed in claim 14, further comprising:

a web on the lower housing component in a region underneath the opening wherein the web and the connector component extend through the opening.

17. A control device as claimed in claim 16, wherein a region of the connector component containing the contact areas is arranged on an end of the web.

18. A control device as claimed in claim 17, wherein the region containing the contact areas is arranged over the first printed circuit board and the contact areas are electrically connected to the first printed circuit board.

19. A control device for a motor vehicle, comprising:

a cooling plate;

a first printed circuit board arranged on an upper side of the cooling plate;

a plug component with plug pins, the plug component arranged on a side of the cooling plate facing away from the first printed circuit board;

a second printed circuit board arranged between the plug component and the cooling plate on the underside of the cooling plate, wherein the plug pins are in contact solely with the second printed cirucit board; and connectng elements for electrically connecting the second printed circuit board to the first printed circuit board.

20. A control device as claimed in claim 19, wherein the plug component is permanently connected to the cooling plate in a region defined by the electrical contact areas between the plug pins and the second printed circuit board.

21. A control device as claimed in claim 19, wherein the connecting elements extend from contact areas on the upperside of the first printed circuit board to contact areas on the upperside of the second printed circuit board.

22. A control device as claimed in claim 19, wherein the plug pins are fitted into the second printed circuit board in a region where the cooling plate has a recess.

* * * * *